(12) United States Patent
Feldmann et al.

(10) Patent No.: US 11,923,482 B2
(45) Date of Patent: Mar. 5, 2024

(54) ULTRA-THIN PHOSPHOR LAYERS PARTIALLY FILLED WITH SI-BASED BINDERS

(71) Applicant: LUMILEDS LLC, San Jose, CA (US)

(72) Inventors: Joerg Feldmann, Aachen (DE); Marcel Rene Bohmer, Eindhoven (NL); Marinus Johannes Petrus Maria van Gerwen, Aachen (DE); Yu-Chen Shen, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 123 days.

(21) Appl. No.: 17/037,293

(22) Filed: Sep. 29, 2020

(65) Prior Publication Data

US 2022/0102593 A1 Mar. 31, 2022

(51) Int. Cl.
*H01L 33/50* (2010.01)
*C09K 11/02* (2006.01)
*C09K 11/70* (2006.01)
*H01L 27/15* (2006.01)
*H01L 33/00* (2010.01)

(52) U.S. Cl.
CPC ............ *H01L 33/501* (2013.01); *C09K 11/02* (2013.01); *C09K 11/025* (2013.01); *C09K 11/70* (2013.01); *H01L 27/153* (2013.01); *H01L 33/005* (2013.01)

(58) Field of Classification Search
CPC ......... C09K 11/00; C09K 11/09; C09K 11/02; C09K 11/025; C09K 11/70; C09K 11/08; C09K 11/646; H01L 27/153; H01L 2933/0041; H01L 33/005; H01L 33/501; H01L 33/502; H01L 33/50; H01L 33/504; H01L 33/508; H01L 2933/0091; H01L 33/56; H01L 33/44; H01L 2924/181; H01L 2224/16225; H01L 2224/8592; H01L 2933/005; H01L 2933/0025; H01L 31/055; H01L 33/52; H01L 33/346; H01S 5/0611; F21K 9/64; G21K 2004/06; G21K 2004/08; G02F 2/006; G02F 2/008; H05B 33/14
See application file for complete search history.

(56) References Cited

U.S. PATENT DOCUMENTS

| | | | |
|---|---|---|---|
| 6,193,908 B1 * | 2/2001 | Hampden-Smith | H05B 33/14 423/511 |
| 2013/0257264 A1 * | 10/2013 | Tamaki | B05D 5/06 313/503 |
| 2015/0200339 A1 * | 7/2015 | Markytan | H01L 33/508 257/98 |
| 2016/0149097 A1 * | 5/2016 | Saka | C23C 16/4417 428/143 |
| 2018/0122993 A1 * | 5/2018 | Camras | C23C 16/45525 |
| 2018/0182932 A1 * | 6/2018 | Murazaki | C09K 11/61 |
| 2019/0169494 A1 * | 6/2019 | Nakamura | C09K 11/02 |
| 2020/0098733 A1 * | 3/2020 | Igarashi | H01L 33/505 |

(Continued)

*Primary Examiner* — Mark W Tornow
*Assistant Examiner* — Priya M Rampersaud

(57) ABSTRACT

A light emitting device and method of forming a light emitting device are disclosed. The light emitting device includes a light emitting diode and a phosphor layer formed on the light emitting diode, the phosphor layer including a plurality of phosphor particles formed in a particle layer, the particle layer including interstices between the phosphor particles, and a matrix material disposed in a portion of the interstices. A plurality of cavities may be disposed in a remaining portion of the interstices.

20 Claims, 12 Drawing Sheets

(56) References Cited

U.S. PATENT DOCUMENTS

| | | | |
|---|---|---|---|
| 2020/0255729 A1* | 8/2020 | Okuno | C09K 11/641 |
| 2020/0301261 A1* | 9/2020 | Hashizume | G03B 21/204 |
| 2022/0066303 A1* | 3/2022 | Hashizume | H05B 33/14 |

* cited by examiner

ULTRA-THIN PHOSPHOR LAYERS PARTIALLY FILLED WITH SI-BASED BINDERS

FIELD OF THE INVENTION

This disclosure generally relates to light emitting devices and more particularly to phosphor layers used in light emitting devices, and method for forming phosphor layers.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Phosphors may be embedded in a silicone matrix that is disposed in the path of light emitted by the LED.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

In one aspect, a light emitting device is disclose, the light emitting device including a light emitting diode and a phosphor layer formed on the light emitting diode, the phosphor layer including a plurality of phosphor particles formed in a particle layer, the particle layer including interstices between the phosphor particles, and a matrix material disposed in a portion of the interstices. A plurality of cavities may be disposed in a remaining portion of the interstices. The matrix material may form a plurality of interstitial portions disposed in the interstices and in contact with the cavities. A majority of the plurality of cavities may be positioned near an upper surface of the phosphor layer opposite a surface of the light emitting diode. At least a portion of the matrix material may be substantially homogeneous and may be disposed at a surface of the light emitting diode. The interstices may have an interstitial volume, and a volume of the cavities may be between 10% and 80% of the interstitial volume. The volume of the cavities may be between 20% and 50% of the interstitial volume. The phosphor layer may further comprise a layer of non-luminous material coating at least a portion of the phosphor particles. The layer of non-luminous material may have a thickness between 100 nm and 400 nm. The matrix may include a silicone or other silicon-based material. The light emitting diode may include a plurality of light emitting diode dies arranged on a chip.

In another aspect, a light emitting device is disclosed, the light emitting device including a light emitting diode, a phosphor layer disposed on the light emitting diode, the phosphor layer including a plurality of phosphor particles disposed in a particle layer, the particle layer comprising interstices between the phosphor particles, and a matrix disposed in the interstices, the matrix comprising a matrix material and a plurality of cavities interspersed in the matrix material. A volume of the cavities may be between 20% and 50% of a volume of the phosphor layer In another aspect, a light emitting device is disclosed, the light emitting device including a plurality of light emitting diodes arranged in an array on a substrate, a phosphor layer disposed on the array, the phosphor layer including a plurality of phosphor particles disposed in a particle layer, the particle layer comprising interstices between the phosphor particles, and a matrix disposed in the interstices, the matrix comprising a matrix material and a plurality of cavities interspersed in the matrix material. The substrate may be a chip and sections of the plurality of light emitting diodes may have separate electrical connections and be individually addressable. The light emitting device may be an automotive headlight, a first section of the plurality of light emitting diodes may be illuminated under a first condition and a second section of the plurality of light emitting diodes may be illuminated under a second condition.

In another aspect, a method of forming a phosphor layer on a light emitting diode includes depositing a thin layer of a formulation on a surface of the light emitting diode, the formulation including phosphor particles, a matrix precursor material, and a solvent, and curing the thin layer to remove the solvent and convert the matrix precursor material into a matrix, a plurality of particles in a particle layer being disposed within the matrix, the matrix including cavities formed within interstices between phosphor particles. The matrix precursor material may include a high index silicone and the solvent may include at least one of PGMEA, toluene, or cyclohexanone. The matrix precursor material may include dimethylsilicone and the solvent may include at least one of heptane or hexamethyldisiloxane. The matrix precursor material may include a mixture of methyl-triethoxy silane, optionally mixed with dimethyl-diethoxy silane. The light emitting diode may include a plurality of light emitting diode dies arranged on a chip.

In yet another aspect, a method of forming a phosphor layer on a light emitting diode includes depositing a layer of phosphor particles on a surface of the light emitting diode, depositing a mixture of matrix precursor material and solvent onto the layer of phosphor particles and curing the mixture of matrix precursor material to remove the solvent and convert the matrix precursor material into a matrix, the matrix infused in interstices between the plurality of particles and including cavities. The method may further include depositing a thin layer of non-luminous material onto the phosphor particles.

DETAILED DESCRIPTION

Figure 1A:
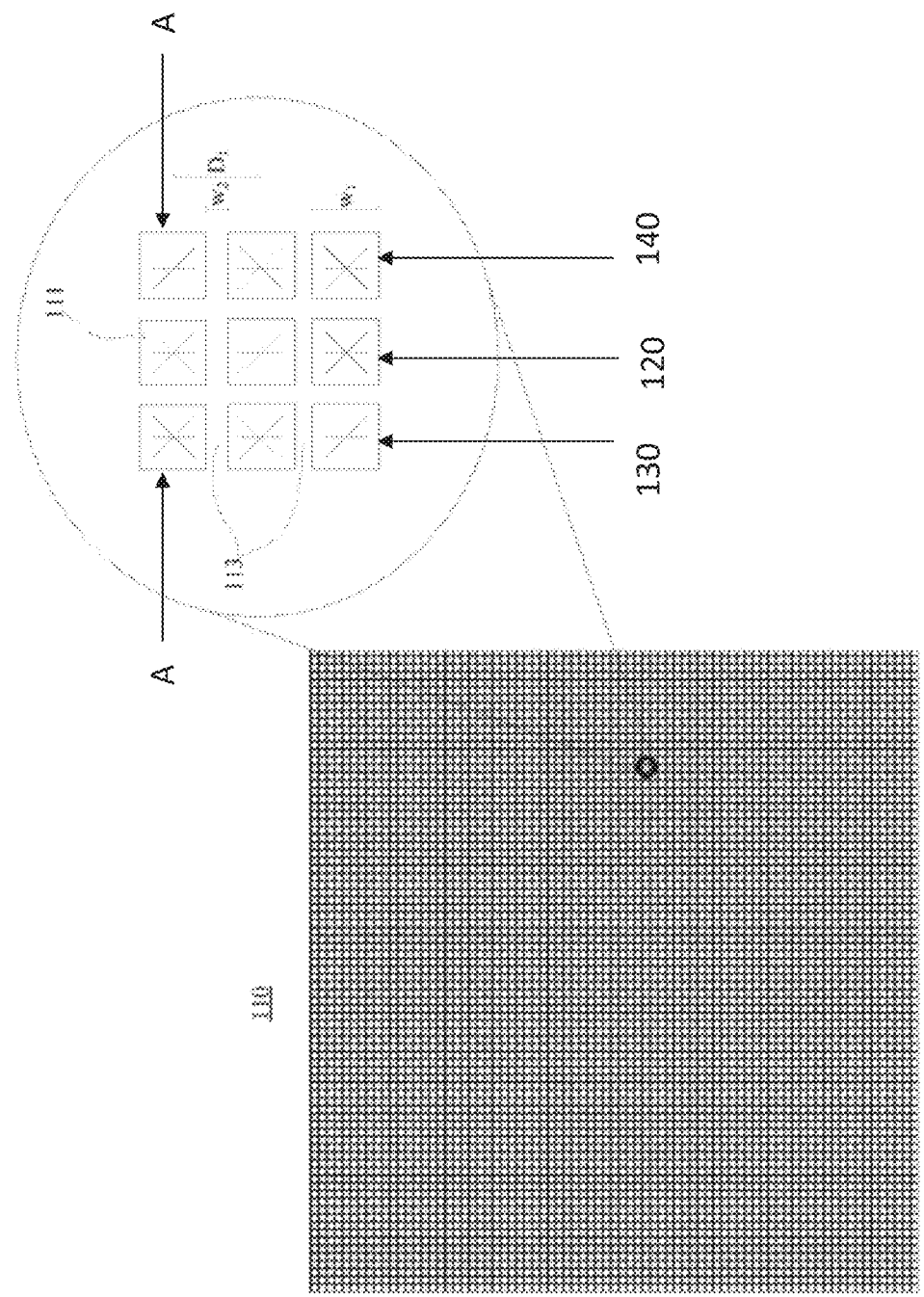
FIG. 1A is a plan view and FIG. 1B a cross-sectional view illustrating an example of a micro-LED. The cross-section view in FIG. 1B is taken through line A-A in FIG. 1A.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

As used herein, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below, depending on the orientation of the device. The device may be otherwise oriented (rotated 90 degrees or at other orientations) and the spatially relative descriptors used herein interpreted accordingly.

Light emitting pixel arrays are light emitting devices in which a large number of small light emitting devices, such as, for example LEDs, are arrayed on a single chip. The individual LEDs, or pixels, in a light emitting pixel array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Light emitting pixel arrays have a wide range of applications. Light emitting pixel array luminaires can include light fixtures which can be programmed to project different lighting patterns based on selective pixel activation and intensity control. Such luminaires can deliver multiple controllable beam patterns from a single lighting device using no moving parts. Typically, this is done by adjusting the brightness of individual LEDs in a 1D or 2D array. Optics, whether shared or individual, can optionally direct the light onto specific target areas Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various street light types, allowing, for example, switching between a linear street light and a semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions Light emitting arrays are also well suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided.

Vehicle headlamps are a light emitting array application that requires large pixel numbers and a high data refresh rate. Automotive headlights that actively illuminate only selected sections of a roadway can be used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

Figure 1B:
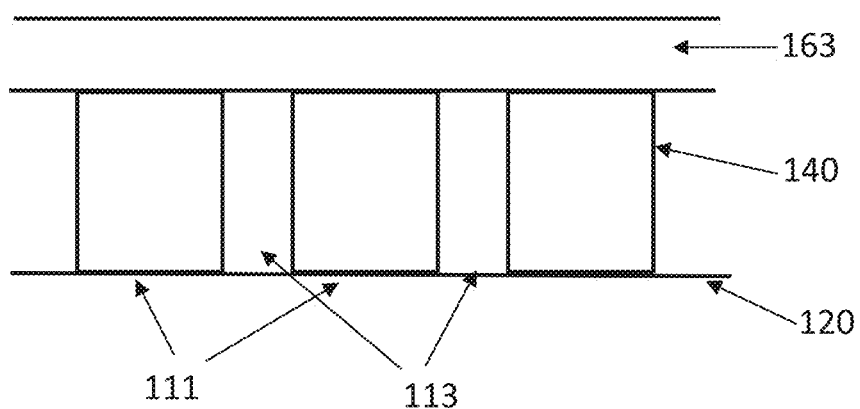

An example of a type of light emitting pixel array is a micro-LED, also referred to as a μLED. FIGS. 1A and 1B illustrate an example of a micro-LED. FIG. 1A shows a plan view of a micro-LED array 110, along with an exploded view of a 3×3 portion of LED array 110. In FIG. 1A, each square 111 represents a single LED, or pixel. As shown in the 3×3 portion exploded view, LED array 110 may include pixels 111 with a width w1, which may be between 30 μm and 500 μm, for example approximately 100 μm or less, e.g. 40 μm. The gaps, or lanes, 113 between the pixels may be separated by a width, w2, which may be less than 50 μm, for example, approximately 10 μm or less, e.g., 5 μm. The lanes 113 may provide an air gap between pixels or may contain other material, as shown in FIG. 1B. The distance d1 from the center of one pixel 111 to the center of an adjacent pixel 111 may be approximately 120 μm or less (e.g., 45 μm). Such a micro-LED array may have hundreds, thousands, or millions of LEDs positioned together on substrates that may have, for example, an area in the range of centimeters, although the size of the area may vary. It will be understood that the widths and distances provided herein are examples only, and that actual widths and/or dimensions may vary.

It will be understood that although rectangular pixels arranged in a symmetric matrix are shown in FIGS. 1A and 1B, pixels of any shape and arrangement may be applied to the embodiments disclosed herein. For example, LED array 110 of FIG. 1A may include 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

Micro-LEDs can be formed from pcLEDs. One method for forming a micro-LED is to use epitaxial growth to form the multiple individual LEDs on a die in a flip-chip construction as in known by persons of ordinary skill in the art. FIG. 1B illustrates a side view of a portion of one type of micro-LED device taken through line AA of FIG. 1A.

FIG. 1B shows the pixels 111 and lanes 113. Each pixel 111 is formed of an LED die 140, which is positioned on, for example, a chip 120, which may provide the electrical signals to the LED die 140 as is known to persons having ordinary skill in the art.

A phosphor layer 163 is over and on LED dies 140. The phosphor layer 163 absorbs light emitted by the LEDs 140 and in response emits light of a longer wavelength. In one example, the individual LEDs produce a blue light and the phosphor is chosen to convert at least a portion of the blue light to another color which mixes with the blue light so that white light is emitted, to produce a micro-LED that is monochrome white at a CCT of about 5700K. FIG. 1B shows phosphor layer 163 as a single layer covering both the LED dies 140 and the lanes 113 between the LED dies 140, but phosphor layer 163 may also be singulated to cover just the LED 140 and may include a spacer (not shown) between LEDs 140.

The phosphor layer 163 may be very thin, and may have a thickness of between 4 μm and 80 μm, for example, the thickness may be between 4 μm and 30 μm, between 10 μm and 20 μm, and in some embodiments between 10 μm and 15 μm, depending on the application. In the methods disclosed herein, very thin phosphor layers, for example at 10 μm to 12 μm, may be formed, although thicker layers are also possible. Phosphor layer 163 can affect both the optical contrast between neighboring pixels and the lumen output of the micro-LED. It is desirable that a micro-LED have high optical contrast between neighboring pixels when one pixel is on and a neighboring pixel is off. Thus, for instance, if the pixels in row 120 of FIG. 1A are in the on state, and pixels in rows 130 and 140 are in the off state, if the contrast is low, light emitted from the pixels in row 120 extends across the adjacent lanes and over the pixels on each side of the row 120, so that rows 130 and 140 do not appear dark, or off. Thus, having low contrast may reduce the performance of the micro-LED in certain applications. In addition to high contrast, it is also desirable that a micro-LED have a high lumen, or light output, which increases the energy efficiency of the lighting device.

Figure 2A:
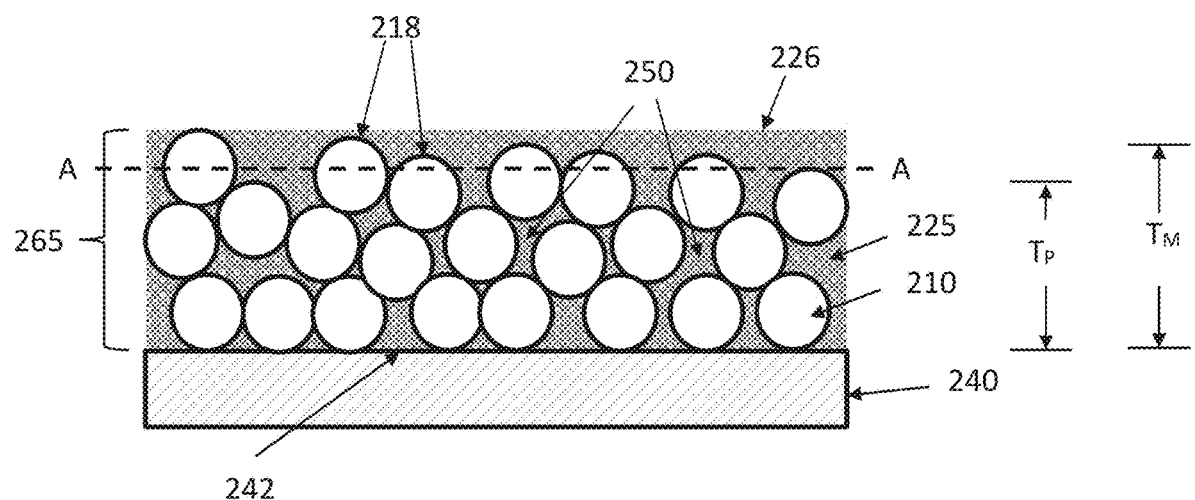
FIG. 2A is a cross-sectional view of a phosphor layer having phosphor particles contained in a matrix.

A phosphor layer 163 may be formed of phosphor particles contained in a matrix. For example, as shown in FIG. 2A, a phosphor layer 265 may be disposed on a surface 242 of LED 240, which may be, for example LEDs 140 of micro-LED 110 as shown in FIGS. 1A and 1B. Phosphor layer 265 may include phosphor particles 210, for example, garnet, contained in a matrix 225. The matrix 225 is formed from a matrix material that acts as a binder to contain and mechanically stabilize the phosphor particles 210 in the phosphor layer 265. To form the phosphor layer 265, a layer of phosphor particles 210 may be applied to the surface 242 using, for example, sedimentation or electrophoretic deposition ("EPD") methods. Then, in the next step, the matrix 225, which may be, for example, a silicon-based material, is infused around the phosphor particles 210 and is used to bind the particles onto the surface 242 of LED 240. As silicones have a refractive index roughly between 1.42 and 1.55, the refractive index differences between the phosphor particles 210 and the material forming matrix 225 are small, and therefore the scattering of the LED light and the phosphor converted light is only moderate, leading to a micro-LED array with poor contrast, but high lumen output.

Note that in FIG. 2A, as well as FIGS. 2B, 4A, 4B, 5A, and 5B, for convenience of description, the phosphor particles 210 are illustrated as circles of uniform size, and the upper surface of matrix 225 is shown as flat. In actuality, the phosphor particles 210 may have a variety of irregular shapes and may vary in size, and the upper surface of the matrix 225 may also be irregular and may conform or partially conform to the shape of the phosphor particles 210. Note, however, that the phosphor particles 210 are illustrated as being in a layer that varies between two and three particles thick ($T_P$, as described below), which is representative of a particle layer thickness that may be used in the phosphor layers disclosed herein.

In FIG. 2A, dashed line AA represents an average height of the surface 218 of the layer of phosphor particles 210, and $T_P$ represents an average thickness of the particle layer taken from the upper surface 242 of LED 240 on which the phosphor particles 210 are positioned to the average height of the phosphor particles 210 represented by dashed line AA. The average thickness $T_P$ of the layer of phosphor particles 210 may be obtained by measuring the thickness with a mechanical or optical profilometer as is known by persons having ordinary skill in the art. Depending on the size of the measuring spot (that is, the size of the stylus, or the size of the optical spot) a series of values over, for instance, a line is obtained. The average thickness $T_P$ is defined as the average value of the readings obtained by the profilometer. A part of the substrate, such as LED 240, over which the phosphor particles 210 have been removed, serves as a reference point. Other methods, such as making a cross-section and using microscopy, may be used to determine a phosphor layer thickness as are known to persons of ordinary skill in the art. The layer of phosphor particles 210 may be two to three individual phosphor particles 410 thick, and thus may have an average thickness $T_P$ of two to three times the average diameter of phosphor particles 210. The average diameter of the phosphor particles 210 may be, for example, in a range of 4 μm to 5 μm and thus for example, $T_P$ may be as thin as 10 μm to 12 μm. The average thickness may also be greater than 12 μm, and depending on the size of the phosphor particles 210 and the number of individual layers of particles, it may be as thick as 80 μm.

As shown in FIG. 2A, the layer of phosphor particles 210 forms interstices 250, which are the spaces or gaps between the phosphor particles 210. Within the phosphor layer 265, the interstices 250 take up a certain volume, which is referred to herein as the "interstitial volume." The interstitial volume is the total volume of the layer less the volume of the particles, where the volume of the layer of phosphor particles=the area of the phosphor particles×the average height $T_P$. The random close packing of monodisperse spheres is 64% (74% for ordered packing), meaning that in a given total volume filled with randomly dispersed spherical particles, 64% of the volume is taken up by the particles, and the remainder, 36% is the volume of the interstices, i.e., the interstitial volume. The phosphor particles 210 in phosphor layer 265 vary in size and shape, and thus are neither spherical nor monodispersed. Depending on the shape and size distribution, the random packing may be higher or lower than that of monodisperse spheres, and a packing density of between 50% and 60% is an often-cited value. In the case of a 50% packing density for the phosphor particles 210 in phosphor layer 265, the remining 50% of the volume of the layer of phosphor particles is the interstitial volume. The interstitial volume will change with the size, shape, and packing density of the phosphor particles 210.

In the phosphor layer 265 shown in FIG. 2A, the phosphor particles 210 are contained within a matrix 225. Matrix 225 of FIG. 2A is formed with a matrix material that is substantially homogeneous and entirely fills the interstices 250. Thus, in FIG. 2A, 100% of the interstitial volume is filled with matrix 225. In FIG. 2A, $T_M$ represents the thickness of the matrix 225, which is a thickness from the upper surface 242 of LED 240 to the upper surface 226 of the matrix 225 (which may be an average thickness as upper surface 226 may not be flat). In phosphor layer 265 the thickness of the matrix 225 $T_M$ is at least as thick, if not thicker, than the thickness of the layer of phosphor particles 210 $T_P$. Thus, the amount of matrix 225 is equal to or greater than the interstitial volume. Assuming a 50% packing volume and thus 50% of the volume is interstitial volume, that means that the volume of material forming matrix 225 is approximately the same as or greater than the volume of the phosphor particles 210.

Figure 2B:
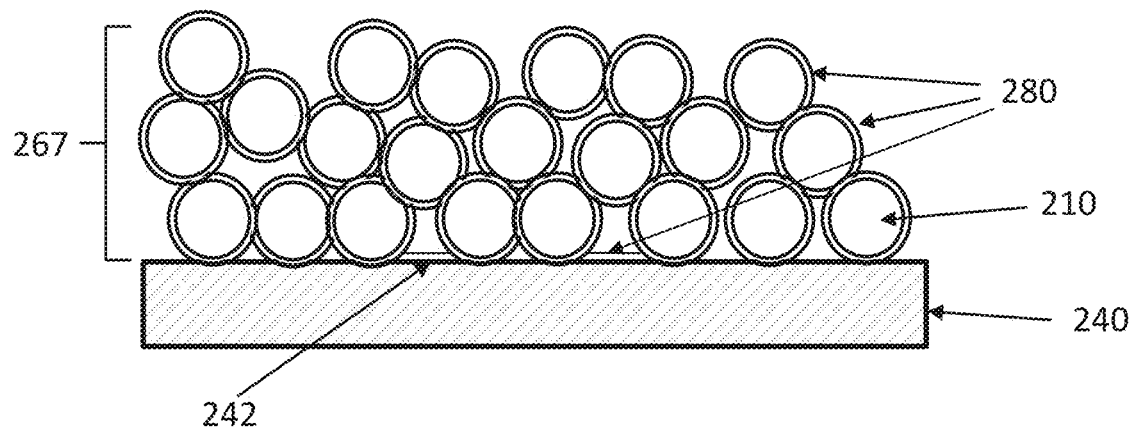
FIG. 2B is a cross-sectional view of a phosphor layer in which phosphor particles are covered in a thin, non-luminous layer.

Another method of forming a phosphor layer 163 includes the use of atomic layer deposition to deposit a thin layer of a non-luminous material onto the phosphor particles. For example, in FIG. 2B, a phosphor layer 267 is disposed on an upper surface 242 of an LED 240 of, for example, a micro-LED, and may include phosphor particles 210 and a thin layer of non-luminous material 280, such as $Al_2O_3$ or $TiO_2$, coating the phosphor particles 210 and which may also be deposited on portions of the upper surface 242 of LED 240. The thin layer of non-luminous material 280 acts to mechanically stabilize the phosphor particles 210 in phosphor layer 267. To form phosphor layer 267, a layer of phosphor particles 210 are applied using, for example, sedimentation or EPD methods. The grains of the phosphor particles 210 are then fixed with a thin layer of non-luminous material 280, which may be applied using atomic layer deposition methods. Such atomic layer deposition of non-luminous materials to form a phosphor layer are described in U.S. patent application Ser. No. 16/887,618, titled "Phosphor Layer for Micro-LED Applications," filed, May 29, 2020 and incorporated herein by reference in its entirety. As noted above with respect to FIG. 2A, the thin layer of non-luminous material 280 is illustrated in FIG. 2B as having a uniform thickness around each phosphor particle 210 for convenience of description, but the thickness of and area covered by the non-luminous material may vary.

Figure 3:
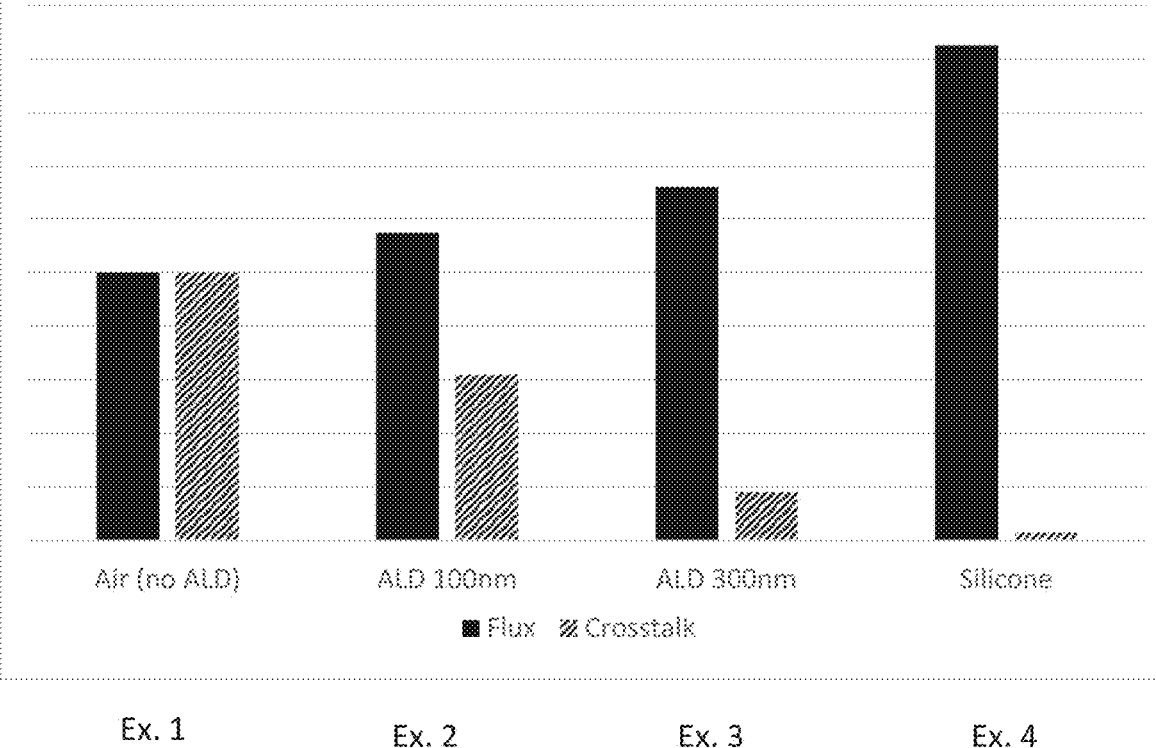
FIG. 3 is a graph showing the light output and contrast for different types of phosphor layers.

FIG. 3 shows simulated data of the optical contrast (crosstalk) between neighboring pixels and lumen output (flux) for four example LEDs having various phosphor layers. Each different phosphor layer results in a certain ratio of light output to contrast between neighboring pixels. Viewing FIG. 3, in Example 1 there is just a layer of particles, and no matrix material or thin non-luminous layer (ALD layer) on the particles. Example 2 and Example 3 include a non-luminous layer, such as is shown in FIG. 2B, with Example 2 having a thinner non-luminous layer (100 nm) and Example 3 a thicker (300 nm) non-luminous layer. Example 4 shows the results for using a full matrix, such as shown in FIG. 2A, that is a high refractive index silicone.

Thus, from the results of the simulation shown in FIG. 3, the ratio of light output to contrast between neighboring pixels in a micro-LED array can be modified. Filling the interstices of the layer of phosphor particles with matrix material, such as with silicones, as shown in FIG. 2A results in a high light output, but also results in contrast between neighboring pixels that is reduced to very low values. Using the non-luminous layer to bind the particles provides an increase in contrast, relative to the silicone matrix. Use of a thicker (300 nm) non-luminous layer to bind the particles increases the light output relative to the thinner (100 nm) non-luminous layer, without reducing contrast as much as does the silicone matrix. Use of a silicone matrix as a binder for the phosphor particles, however, has the advantage of a much faster process time (and reduced costs) and less temperature load on the device when preparing micro-LEDs, than the use of a thicker ALD non-luminous layer.

Figure 4A:
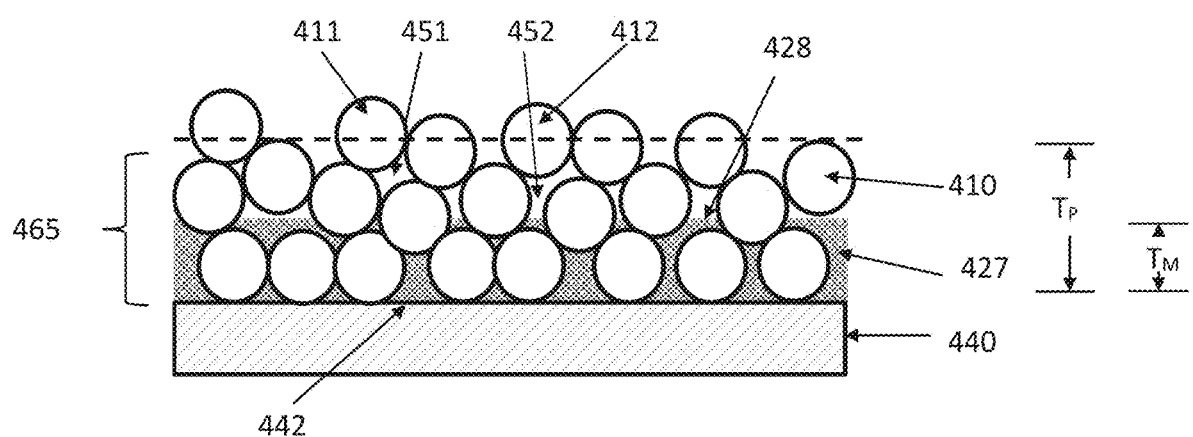
FIG. 4A is a cross-sectional view of a phosphor layer having phosphor particles a matrix partially filling the interstices between the phosphor particles.
Figure 4B:
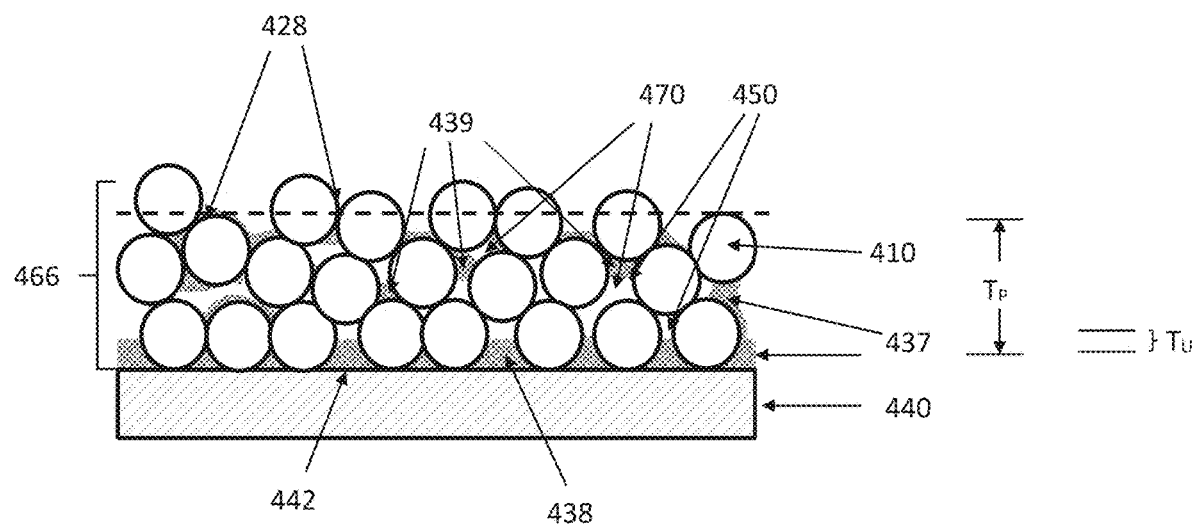
FIG. 4B is a cross-section view of a phosphor layer having phosphor particles and a matrix with cavities and partially filling the interstices between the phosphor particles.

FIGS. 4A and 4B illustrate phosphor layers in which a matrix material is used as a binder, but in which the amount of matrix material used to form the matrix is less than the interstitial volume, and which leaves the interstices within the layer of phosphor particles partially or wholly open, and unfilled with matrix material. The use of partially or wholly unfilled interstices serves to increase the contrast provided by such phosphor layers as compared to a phosphor layer with a matrix which fully fills the interstices, such as the phosphor layer shown in FIG. 2A.

In FIG. 4A, phosphor layer 465 includes phosphor particles 410 and matrix 427 on light emitting surface 442 of LED 440. The thickness $T_P$ is the average thickness of the layer of deposited phosphor particles 410 in phosphor layer 465 as disclosed above with respect to FIG. 2A. Similar to FIG. 2A, the matrix 427 in FIG. 4A is formed from a matrix material that is substantially homogeneous, and matrix 427 is formed on the light emitting surface 442 of LED 440. However, less matrix material is used to form matrix 427, such that the volume of matrix material is less than the interstitial volume of interstices 451,452 in phosphor layer 465. As there is less volume of matrix 427 than interstitial volume, interstices, for example 451 and 452, between phosphor particles 410 in an upper portion of the phosphor layer 465 are left partially or wholly unfilled. The amount of open and partially filled interstices such as 451/452 depends on the volume of the material for matrix 427 used as compared to the interstitial volume in the layer of phosphor particles 410. So, for example, if the packing density of the phosphor particles 410 is 50%, then the remaining 50% of the volume of the phosphor layer is interstitial volume. The interstices can be filled, for example, with 10% of the total volume material for matrix 427 and thus a remaining 40% of the volume of the phosphor layer is open and unfilled. If, for example, the packing density is 60%, then the remaining 40% may be, for example, 10% material for matrix 427 and a remaining 30% unfilled. When the material for matrix 427 is substantially homogenous, it will fill the lower portion of the interstices. An upper surface 428 of the matrix 427 will be below the average height AA of the layer of phosphor particles 410. In other words, the average thickness of matrix 427 $T_M$ is less than $T_P$. when the matrix 427 is homogenous and has less volume than the interstitial volume. The resulting phosphor layer 465 has an increased contrast relative to a phosphor layer completed filled with matrix (FIG. 2A), while also providing an increase in the lumen output of the LED 440.

While phosphor layer 465 of FIG. 4A improves the contrast as compared to a fully filled matrix (FIG. 2A), there may be a problem in that, when matrix 427 is uniform and homogeneous, then depending on the volume of the matrix 427, which determines the thickness $T_M$ for such homogenous material, the matrix 427 may not surround or contact all of the phosphor particles, for example phosphor particles 411 and 412. Thus, such phosphor particles are not bound in the phosphor layer 465 by matrix 427, and may be loose and not stay in phosphor layer 465. When the volume of the homogenous matrix 427 is low enough to allow for portions of the interstices to be open, which improves contrast while still allowing a relatively high lumen output, there may not be enough matrix to provide the mechanical stability necessary to keep the layer of phosphor particles in place. In other words, to keep the layer of phosphor particles 410 in place in the phosphor layer 465, there needs to be enough matrix 427 that the amount of open, unfilled or partially filled interstices, which improves contrast, may not provide a desired amount of contrast.

FIG. 4B illustrates a phosphor layer 466 that reduces the potential for loose phosphor particles as compared to phosphor layer 465 of FIG. 4A. In FIG. 4B, phosphor layer 466 includes phosphor particles 410 and matrix 437 on light emitting surface 442 of LED 440. The matrix 437 is formed in such a way (described in more detail below) that it is porous, and cavities 470, which are open and may contain air and/or other gases, are formed within the matrix 437. Interstitial portions 439 of matrix 437 form from matrix material that is located in the interstices 450 between phosphor particles 410 and around the cavities 470. Thus, the interstitial portions 439 of matrix 437 bind phosphor particles, such as phosphor particles 411 and 412, to phosphor layer 466. The cavities 470 are formed within the interstices 450 of the layer of phosphor particles 410 and within and/or adjacent to the matrix material forming the interstitial portions 439 of matrix 437. Cavities 470 may be fully surrounded by matrix material that forms matrix 437, i.e., interstitial portion 439 may fully contain one or more cavities 470. Cavities 470 may have a portion along a side of phosphor particles 410 and a side formed in the matrix material forming the matrix 437, that is an interstitial portion 439. Cavities 470 may fully fill an interstice 450. Interstitial portions 439 may conformally coat portions of phosphor particles 410 around edges of an interstice 450, to form a cavity 470 that is almost as large as the interstice 450. The portions of the interstices not taken up by the interstitial portion 439 of the matrix material are the cavities 470. Cavities 470 may have a variety of shapes and sizes. There may be multiple cavities 470 within an interstice 450. The cavities 470 may improve contrast by causing more scattering in the phosphor layer 465.

Matrix 437 of phosphor layer 466 may also have a homogeneous section 438 formed from matrix material that does not include cavities 470. Homogeneous section 438 may be formed at or near the light emitting surface 442. The matrix material forming homogeneous section 438 is more homogenous and uniform than the rest of the matrix 437 and does not include cavities 470. Homogenous section 438 contains and binds those portion of phosphor particles 410 of phosphor layer 466 that are within the homogenous section. While the cavities 470 may improve contrast by causing more scattering, the homogeneous section 438 at the light emitting surface 442 may improve extraction of light from the LED 440, and thus improve light output. Matrix 437 may also be formed without a homogeneous section 438, and the cavities 470 may extend to the light emitting surface 442.

The interstitial portions 439 form throughout the interstices 450 of the layer of phosphor particles 410 such that phosphor particles such as 411 and 412 at the top of the layer of phosphor particles 410 are bound in the phosphor layer 466, avoiding the problem discussed with respect to FIG. 4A. Thus, the although the volume of the matrix material used to form matrix 437 is less than the interstitial volume, because of the cavities 470, the matrix material extends to the top of the layer of phosphor particles 410. The interstitial volume may be fully filled with the cavities 470, interstitial portions 439, and homogeneous section 438 that form the matrix 437. An upper surface 428 of matrix 437 is therefore at approximately the same place as the upper surface of the layer of particles 410. A total volume of the matrix material in interstitial portions 439 and homogenous section 438 plus the volume of the cavities 470 is equal to the interstitial volume. The volume of the matrix material forming interstitial portions 439 and homogeneous section 438 is less than the interstitial volume because of the cavities 470.

Similar to the matrix 465 in FIG. 4A, if, for example, the packing density of the phosphor particles 410 is 50%, then the remaining 50% of the volume of the phosphor layer is interstitial volume. If 10% of the phosphor layer is matrix in the interstices (interstitial portions 439), and there is not homogeneous section 438, and a remaining volume of the phosphor layer (40%) is cavities in the interstices. In other words, in this example, the cavities would fill 80% of the interstitial volume, and the interstitial portions of the matrix would fill 20% of the interstitial volume. The interstitial volume may change with the packing density of the phosphor particles. Total volume of the cavities 470 in matrix 437 may be between 10% and 80% of the interstitial volume of phosphor layer 466, and more particularly between 20% and 50%, of the interstitial volume of phosphor layer 466. Thus, the amount of matrix material may be 90% to 20%, more particularly 80% to 50% of the interstitial volume of phosphor layer 466. The size and number of the cavities 470 may depend on the method used to form matrix 437, including the type of matrix material and solvent used as disclosed below. The size of the cavities 470 may also depend on the size of the phosphor particles 410, as cavities 470 form in the interstices of the phosphor particles 410. The cavities 470 may be positioned within matrix 437 opposite the homogeneous section 439, and closer to an upper portion of the layer of phosphor particles 410.

The portion of volume of the matrix 437 forming the homogenous section 438 may be between 1% and 30% the volume of the matrix 437, for instance between 5% and 10%, of the volume of the matrix 437. An upper surface of homogeneous section 438 is below the average height of the layer of phosphor particles, as indicated by line AA, and the homogenous section 438 may have an average thickness $T_U$ that is less than $T_P$, in particular, $T_U$ may be less than or equal 10% of $T_P$.

Figure 5A:
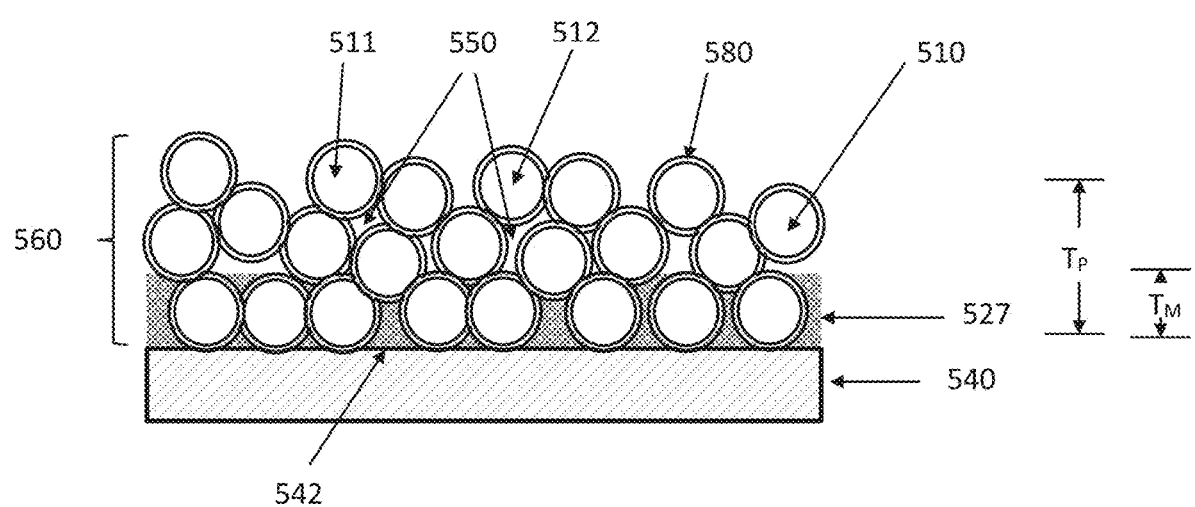
FIG. 5A is a cross-sectional view of a phosphor layer in which phosphor particles are covered in a thin, non-luminous layer and having a matrix partially filling the interstices between the phosphor particles.
Figure 5B:
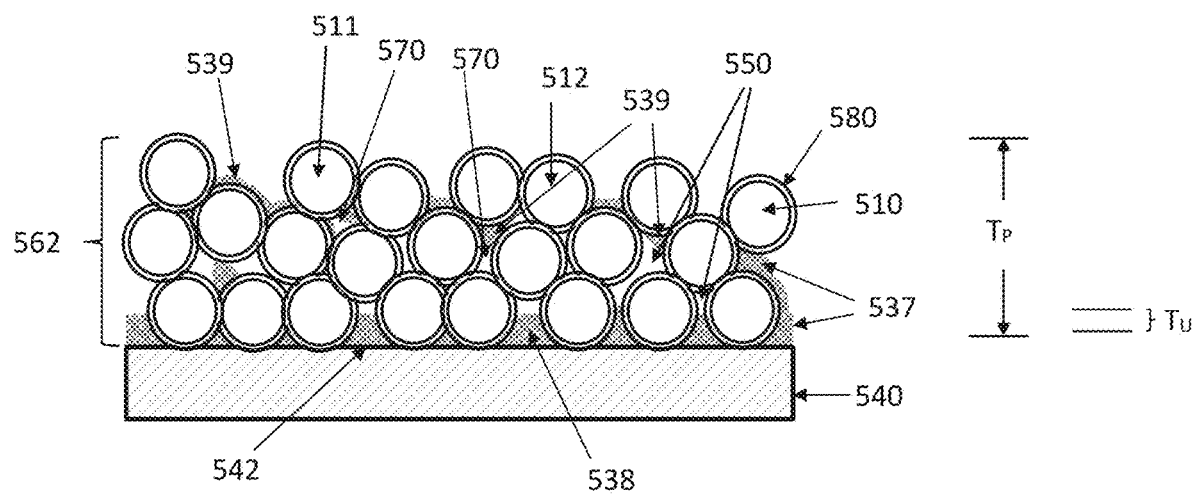
FIG. 5B is a cross section view of a phosphor layer in which phosphor particles are covered in a thin, non-luminous layer and having a matrix with cavities and partially filling the interstices between the phosphor particles.

FIGS. 5A and 5B illustrate phosphor layers that include a thin non-luminous layer and a matrix binder.

In FIG. 5A, phosphor layer 560 includes phosphor particles 510 in a matrix 527. Similar to FIG. 4A, the matrix 527 in FIG. 5A is formed from a matrix material that is substantially homogeneous, and matrix 527 is formed on the light emitting surface 542 of LED 540. The phosphor layer 560 includes a thin layer of non-luminous material 580 deposited on the phosphor particles 510. The thin layer 580 may be formed of, for example, $Al_2O_3$ or $TiO_2$, and may have a thickness of between 100 nm and 400 nm. The thin layer 580 may be, for example, a silicone material formed to coat the particles 510. The thin layer 580 may act to mechanically stabilize phosphor particles, for example particles 511 and 512, that are not bound in the matrix 527 to prevent such particles from becoming loose. The thin layer 580 may mechanically stabilizes phosphor particles 510 around the interstices 550. The matrix 527 that is positioned at light emitting surface 542 of the LED 540 may be formed from a matrix material that is homogeneous and uniform, and may enhance the lumen output of the LED 540 by allowing more light to be emitted through the light emitting surface 542 and into matrix 527. The matrix 527 may have a thickness $T_M$ that is less than the average thickness of the layer of particles $T_P$. The volume of matrix material in matrix 527 is less than the volume of the interstices, and may be, for example, 10% to 50% of the interstitial volume.

In FIG. 5B, phosphor layer 562 includes phosphor particles 510 in a matrix 537. Similar to the phosphor layer 560 of FIG. 5A, in phosphor layer 562 a thin layer of non-luminous material 580 is deposited on the phosphor particles 510. The thin layer 580 may be formed of, for example, $Al_2O_3$ or $TiO_2$, and may have a thickness of between 100 nm and 400 nm. The thin layer 580 may be, for example, a silicone material formed to coat the particles 510. Similar to phosphor layer 466 of FIG. 4B, the matrix 537 in phosphor layer 562 is formed in such a way (described in more detail below) that it is porous. Matrix 537 in phosphor layer 562 includes cavities 570 and interstitial portions 539 that bind particles 510 around the cavities 570 similar to cavities 470 and interstitial portions 439 disclosed above with respect to FIG. 4B. Phosphor layer 562 may also have a homogeneous section 538 at the light emitting surface 542 that is formed of a matrix material that is substantially homogenous and uniform and does not include cavities 570, similar to homogeneous section 438 in FIG. 4B. Thus, both the thin non-luminous layer 580 and the interstitial portions 539 may act to mechanically stabilize phosphor particles, for example particles 511 and 512, that are not bound in the matrix 527 to prevent such particles from becoming loose. Similar to matrix 437 shown in FIG. 4B above, homogeneous portion 538 may enhance the lumen output of the LED 540 by allowing more light to be emitted through the light emitting surface 542 and into matrix 527 and cavities 570 may enhance contrast by increasing scattering.

Phosphor layers disclosed herein, such as phosphor layer 466 of FIG. 4B, phosphor layer 560 of FIG. 5A, and phosphor layer 562 of FIG. 5B, may be useful when using LED arrays in automotive applications, such as headlights, where higher lumen output while maintaining contrast between illuminated and non-illuminated pixels is desirable.

Figure 6A:
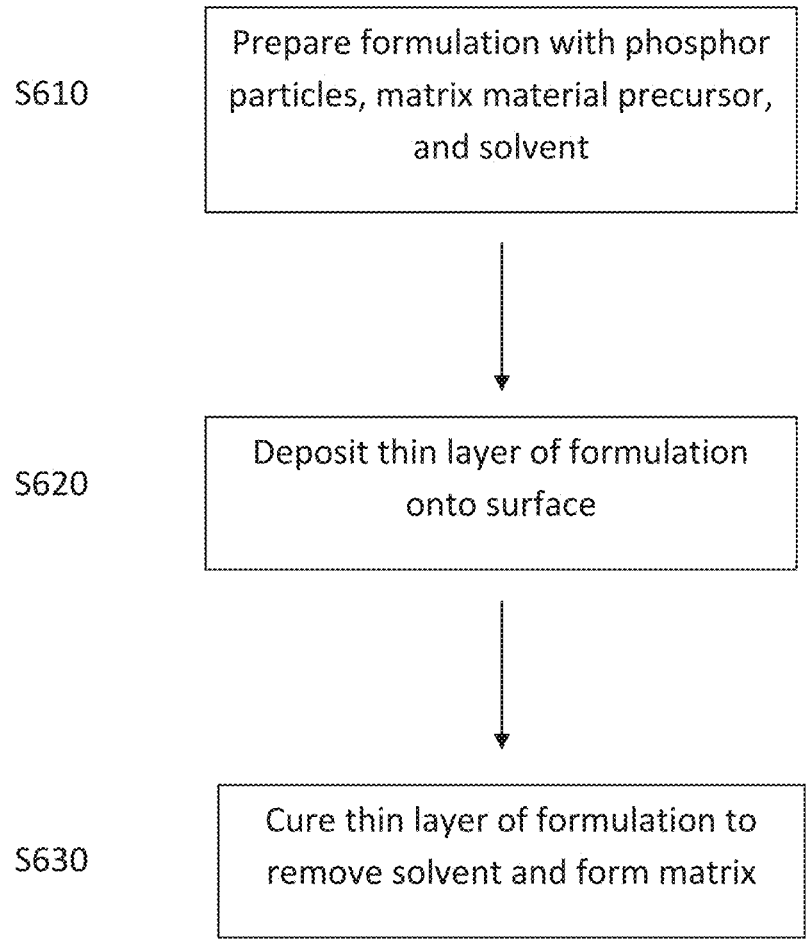
FIG. 6A is a flow diagram of a method of forming a phosphor layer.
Figure 6B:
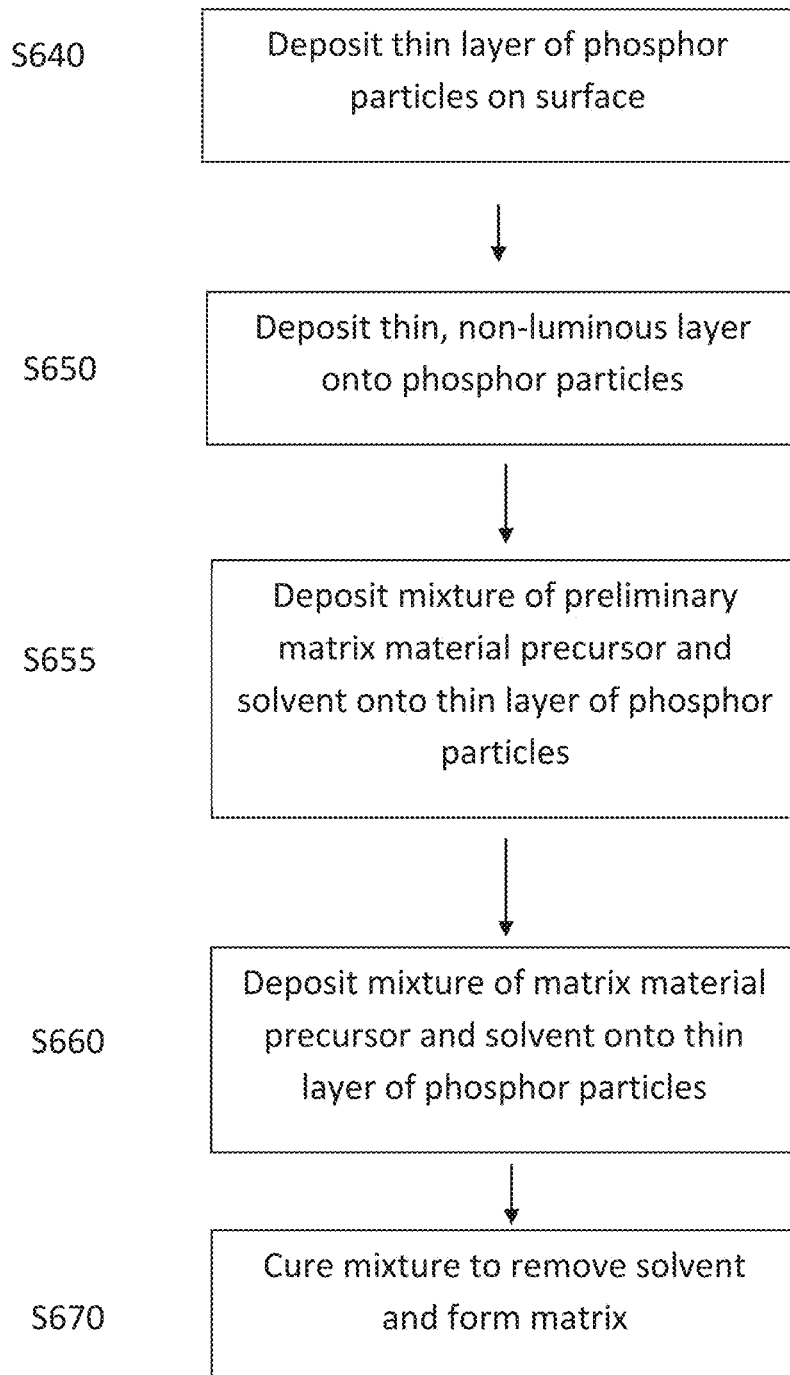
FIG. 6B is a flow diagram of another method of forming a phosphor layer.

FIGS. 6A and 6B illustrate methods for forming phosphor layers disclosed herein.

In FIG. 6A, at S610, a formulation is prepared that contains phosphor particles, matrix material precursor, and solvent. The phosphor particles used may be any suitable phosphor for the intended lighting application, and may include, for example, garnet particles such as Yttrium Aluminum Garnet ("YAG"). The matrix material precursors and solvents that may be used will be described in more detail below.

At S620, a thin layer of the formulation can be deposited on a surface of the LED or micro-LED by any one of various coating technologies, such as, for example sedimentation, electrophoretic deposition, blade coating, etc.

At S630, the thin layer of formulation is cured to remove the solvent and convert the matrix material precursor to form the matrix. Such curing may involve methods including, for example, heating, drying, adding a chemical agent, such as an acid, and/or any one of a number of other curing methods as are known to persons having ordinary skill in the art. The particular curing method used depends on the matrix precursor material used, as will be described in more detail below. Curing causes the matrix material precursor to form the matrix and removes the solvent, leaving the phosphor particles embedded in the cured matrix. As the formulation is cured, cavities may form in the matrix material and within the interstices between the phosphor particles, resulting in, depending on the choice and concentrations of matrix material and solvent, a phosphor layer such as phosphor layer 465 of FIG. 4A or phosphor layer 466 of FIG. 4B.

In FIG. 6B, at S640 phosphor particles are deposited on a surface of the LED or micro-LED by any one of various methods for dispersing a thin layer of particles, such as, for example sedimentation, electrophoretic deposition, blade coating, etc. Any solvent used in depositing the particles is then removed, leaving a thin layer of phosphor particles on the surface. The phosphor particles used may be any suitable phosphor for the intended lighting application, and may include, for example, garnet particles, such as YAG.

At S650, an optional thin, non-luminous layer, such as for example, $Al_2O_3$ or $TiO_2$, may be deposited on the particles using, for example, atomic layer deposition, as described in U.S. patent application Ser. No. 16/887,618, titled "Phosphor Layer for Micro-LED Applications," filed, May 29, 2020 and incorporated herein by reference in its entirety.

As S655, an optional thin layer of a preliminary matrix material precursor may be applied to the phosphor particles. A mixture of the preliminary matrix material precursor and solvent is added to the thin layer of particles on the surface. The preliminary matrix material precursors and solvents that may be used will be described in more detail below. The mixture of preliminary matrix material precursor and solvent is applied using a method that does not disturb the phosphor particles, which may include, for example, spray coating, and/or dip coating. Homogeneous application, in which the layer thickness of the preliminary matrix material precursor is highly controlled, is needed to control the amount of preliminary matrix material precursor coated onto the phosphor particles. The solvent used may be removed before S660.

At 660, a mixture of the matrix material precursor (which may be the only matrix material precursor used if optional S655 if not performed in the method) and solvent is added to the thin layer of particles on the surface. The matrix material precursors and solvents that may be used will be described in more detail below. The mixture of matrix material precursor and solvent is applied using a method that does not disturb the phosphor particles, and may include, for example, spray coating, and/or dip coating. If the matrix material precursor is added by infusion, after deposition of the phosphor layer, homogeneous application, in which the layer thickness of the matrix material precursor is precisely controlled, is needed to control the amount of matrix material precursor deposited over and into the phosphor particles, for instance by applying a fine spray.

When S655 and S660 are both performed, forming the matrix may involve first depositing a thin layer of a preliminary matrix material precursor, such as a sol-gel material as described below, for instance, via a dip coating. After deposition of the preliminary matrix material precursor, a matrix material precursor, such as a silicone, may be applied via another method, such as, for instance, spray coating. Solvents used for deposition may be removed between deposition of the preliminary matrix material precursor and matrix material precursor, or after deposition of both. Alternatively, the preliminary matrix material precursor for S655 may be a silicone and the matrix material precursor for S660 may be a sol-gel material.

At S670, the mixture of matrix material precursor and solvent is cured to convert the matrix material precursor into the matrix. Such curing may involve methods disclosed above, and causes the matrix material precursor to form the matrix and removes the solvent, leaving the phosphor particles embedded in the cured matrix material. As the mixture is cured, cavities form in the matrix material and within the interstices between the phosphor particles, resulting in phosphor layers such a phosphor layer 466 of FIG. 4B and phosphor layer 562 of FIG. 5B as disclosed above.

The matrix material precursor used for either the formulation at S610 or the mixture prepared at S650 or S660 may be any compound or mixture of compounds that are capable of forming a matrix infused in the interstices and around the phosphor particles as shown in FIGS. 4A, 4B, 5A, and 5B above, and that has an appropriate refractive index for the intended lighting application. For example, matrix material precursor may be a silicone, such as a high index silicone as are known to persons having ordinary skill in the art.

The solvent used with the matrix material precursor may be any solvent that when the mixture is cured, and the solvent is removed, leaves a matrix that includes cavities within the matrix of the phosphor layer, and which may also cause a more homogenous and more uniform portion of the matrix at the light emitting surface. For example, a solvent may be chosen that evaporates before the crosslinking of the silicone takes place, and thus the silicone may concentrate at the bottom of the layer, in contact with the light emitting surface. Typical solvents used are PGMEA (propylene glycol methyl ether acetate), toluene or cyclohexanone for high index silicones (that giving better outcoupling of light from garnet or heptane or hexamethyldisiloxane (HMDSO) for dimethylsilicones that have a lower refractive index (more scattering, worse outcoupling).

By diluting the silicone with a suitable solvent, part of the cross-linking can occur before all the solvent is evaporated. The use of a specific curing mechanism, such as curing from the gas phase (using, for example a vapor phase cure process or Stokes process, such as those disclosed in U.S. Pat. No. 10,767,016 titled "Vapor Phase Curing Catalysis and Passivation of Siloxane Resins in LED Applications," filed Feb. 8, 2017 and incorporated herein by reference in its entirety) may enhance the formation of cavities in the phosphor layer.

As an alternative, or in addition to, use of a silicone matrix material precursor with solvent as described above, the matrix material precursor may be a compound or compounds that can be used in a sol-gel chemistry method. In sol-gel chemistry, alkoxy groups are hydrolyzed and in the subsequent condensation between two hydrolyzed groups, say silanol groups, water is released and if one group is hydrolyzed and the other is not, an alcohol is released. As sol-gel is much stronger crosslinked than the silicones that are used for optical applications, this can lead to significant shrinkage during cross linking. In addition, sol-gel materials are always used in solvents, including the alcohols that are formed in the hydrolysis reaction, therefore a porous particle layer will be formed using sol gel. Such sol-gel matrix material precursor may be, for instance, silicon based sol-gels, and therefore may have refractive indices $R_i$ in a range of 1.4 to 1.6.

In general sol-gel materials are, due to the shrinkage often limited to relatively thin layers. For formation of phosphor layers as shown in FIGS. 4A, 4B, 5A, and 5B, the use of hybrid sol-gel materials as the matrix material precursor may be especially beneficial. Typical hybrid sol-gel materials that are used as the matrix material precursor are mixtures methyl-triethoxy silane and dimethyl-diethoxy silane. The methyl-triethoxy silane can form 3 siloxane bonds per silicone atom and the dimethyl-diethoxy silane can form only two siloxane bonds per silicone atom. A mixture of the two precursors can be formulated and cured by hydrolyzing with addition of an acid (acetic acid) and water. The mixture is chosen such that the layer is not prone to cracking after, for instance, a solder reflow process, while for a sol-gel precursor such as tetra-ethoxy silane, such cracks are frequently found upon (rapid) cooling down.

Figure 7:
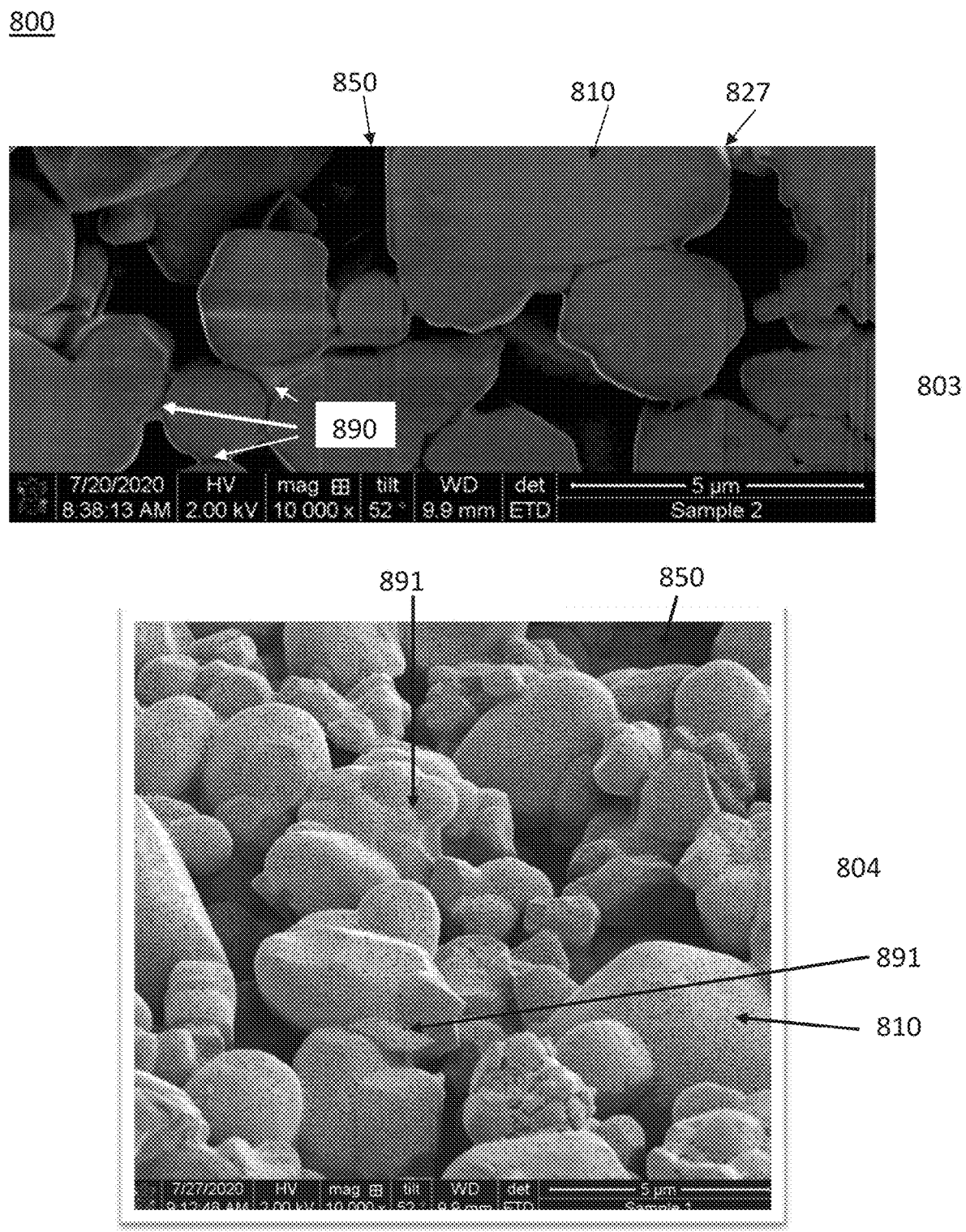
FIG. 7 is a scanning electron micrograph of a cross-section of, and a scanning electron micrograph of a top view of, another phosphor layer having a matrix with cavities and partially filling the interstices between the phosphor particles.

FIG. 7 is a scanning electron micrograph 800 of another example of a phosphor layer according to this disclosure and shows a 10,000× cross-section (803) and a 10,000× top view (804) of the phosphor layer. The phosphor layer in the micrograph 800 was formed using EPD to apply the phosphor particles 810 and then a sol-gel matrix precursor material was infused into the phosphor particles and cured to form the matrix 827. The sol-gel formed matrix forms a coating on the phosphor particles 810, and especially accumulates in interstices 890 near where the phosphor particles 810 are in contact. The top view 804 also shows that the phosphor particles 810 are bound by the sol-gel formed matrix at 891. Cavities 850 are also visible.

Example A: An LED was coated with YAG fluorescent powder phosphor particles with an average grain size of 5 μm (d50=5 μm; range: 3-9 μm) to achieve the required color point for the resulting lighting device. A thin layer of $Al_2O_3$ was applied to the phosphor particles using atomic layer deposition (as described in U.S. patent application Ser. No. 16/887,618, titled "Phosphor Layer for Micro-LED Applications," filed, May 29, 2020 and incorporated herein by reference in its entirety). A mixture of high index silicone and toluene was formed. The silicones used were Dow Corning OE7662 Silicones. Dow Corning® OE-7662 Optical Encapsulant is a two-part, heat cured silicone encapsulant designed for optical application. The toluene was anhydrous 99.8% (Merck, Germany). The silicones/toluene weight ratio was ⅕. The silicone/toluene weight ratio may be between 1/1 to ⅕ depending on the flux gain and contrast required for the application of the device, a higher proportion of silicone increases the flux but reduces the contrast (although there is an upper limit on the increase in flux). The mixture of silicone and toluene was mixed in a speed mixer for 2 minutes at 100 rpm under vacuum. Vacuum is used to extract bubbles from the silicones/toluene mixture. The mixture was then transferred to a dispensing unit (Nordson Ultius I using a 3 mm Nordson KET O BRL/Pist 3CC CL/WH syringe and Nordson 32GA GP 0.004X.250 YLW tip) The mixture was dispensed onto the LED from the dispensing unit using settings of ⅙ Bar and 0.0005 seconds. The dispensed mixture spreads easily, but use of spinning equipment of rotation may be used to enhance spread. The mixture was cured at 150° C. for 2 hours.

Example B: An LED was coated with YAG fluorescent powder phosphor particles with an average grain size of 5 μm (d50=5 μm; range: 3-9 μm) to achieve the required color point for the resulting lighting device applied by electrophoretic deposition. The LED was dipcoated in a 20% sol-gel solution containing hydrolysed methyl-trimethoxy silane in isopropanol with a withdrawal rate of 2.5 mm/s. After curing at 150° C., the LED was again dipcoated in a solution of silicone in heptane (20%). After evaporation of the heptane the silicone was cured at 150° C.

What is claimed is:

1. A light emitting device comprising:
   a light emitting diode; and
   a phosphor layer formed on the light emitting diode, the phosphor layer comprising:
      a plurality of phosphor grains formed in a particle layer, the particle layer comprising interstices between the phosphor grains;
      a silicone or sol-gel matrix material disposed in a portion of the interstices, wherein the matrix material disposed in the portion of the interstices is not in contact with the light emitting diode; and
      a plurality of cavities disposed in a remaining portion of the interstices, at least one of the plurality of cavities having a first side adjacent to the silicone or sol-gel matrix material and a second side adjacent to the at least one of the plurality of phosphor grains.

2. The light emitting device of claim 1, wherein the matrix material forms a plurality of interstitial portions disposed in the interstices and in contact with the cavities.

3. The light emitting device of claim 2, wherein a majority of the plurality of cavities are positioned near an upper surface of the phosphor layer opposite a surface of the light emitting diode.

4. The light emitting device of claim 1, wherein the interstices have an interstitial volume, and a volume of the cavities is between 10% and 80% of the interstitial volume.

5. The light emitting device of claim 4, wherein the volume of the cavities is between 20% and 50% of the interstitial volume.

6. The light emitting device of claim 1, wherein the matrix comprises a silicone material.

7. The light emitting device of claim 1, wherein the light emitting diode comprises a plurality of light emitting diode dies disposed on a chip and arranged in an array.

8. A light emitting device comprising:
   a light emitting diode; and
   a phosphor layer disposed on the light emitting diode, the phosphor layer comprising:
      a plurality of phosphor grains disposed in a particle layer, the particle layer comprising interstices between the phosphor grains;
      a matrix disposed in the interstices, the matrix comprising a silicone or sol-gel matrix material, wherein the matrix material disposed in the interstices is not in contact with the light emitting diode; and
      a plurality of cavities interspersed in the matrix material, at least one of the plurality of cavities having a first side adjacent to the silicone or sol-gel matrix material and a second side adjacent to the at least one of the plurality of phosphor grains.

9. The light emitting device of claim 8, wherein a volume of the cavities is between 20% and 50% of a volume of the phosphor layer.

10. The light emitting device of claim 1, wherein the phosphor layer comprises at least another one of the plurality of cavities having all sides adjacent to at least one of the plurality of phosphor grains.

11. The light emitting device of claim 1, wherein the phosphor layer comprises at least one phosphor grain not bound to any other phosphor grain.

12. A light emitting device comprising:
    a light emitting diode; and
    a phosphor layer formed on the light emitting diode, the phosphor layer comprising:
       a plurality of phosphor particles;
       interstices between the phosphor particles;
       a silicone or sol-gel matrix material not in contact with the light emitting diode disposed in a portion of the interstices; and
       a plurality of cavities situated in a remaining portion of the interstices, at least one of the plurality of cavities having a first side adjacent to the silicone or sol-gel matrix material and a second side adjacent to the at least one of the plurality of phosphor particles, and at least another one of the plurality of cavities having all sides adjacent to at least one of the plurality of phosphor particles.

13. The light emitting device of claim 12, wherein the matrix material forms a plurality of interstitial portions disposed in the interstices and in contact with the cavities.

14. The light emitting device of claim 12, wherein a majority of the plurality of cavities are positioned near an upper surface of the phosphor layer opposite a surface of the light emitting diode.

15. The light emitting device of claim 12, wherein the interstices have an interstitial volume, and a volume of the cavities is between 10% and 80% of the interstitial volume.

16. The light emitting device of claim 15, wherein the volume of the cavities is between 20% and 50% of the interstitial volume.

17. The light emitting device of claim 12, wherein the phosphor particles comprise a layer of non-luminous material coating.

18. The light emitting device of claim 17, wherein the layer of non-luminous material has a thickness between 100 nm and 400 nm.

19. The light emitting device of claim 12, wherein the matrix comprises a silicone material.

20. The light emitting device of claim 12, wherein the phosphor layer comprises at least one phosphor particle not bound to any other phosphor particle.

* * * * *